(12) United States Patent
Ju et al.

(10) Patent No.: US 10,199,756 B2
(45) Date of Patent: Feb. 5, 2019

(54) ELECTRICAL CONNECTOR

(71) Applicant: LOTES CO., LTD, Keelung (TW)

(72) Inventors: Ted Ju, Keelung (TW); Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/866,901

(22) Filed: Jan. 10, 2018

(65) Prior Publication Data

US 2018/0198226 A1 Jul. 12, 2018

Related U.S. Application Data

(60) Provisional application No. 62/445,396, filed on Jan. 12, 2017.

(30) Foreign Application Priority Data

Aug. 10, 2017 (CN) .......................... 2017 1 0678582

(51) Int. Cl.
*H01R 12/00* (2006.01)
*H01R 12/71* (2011.01)
(Continued)

(52) U.S. Cl.
CPC ........... *H01R 12/716* (2013.01); *H01R 12/52* (2013.01); *H01R 12/57* (2013.01);
(Continued)

(58) Field of Classification Search
CPC ............ H01R 13/2435; H01R 13/2457; H01R 13/2464; H01R 12/52; H01R 12/57; H01R 12/7076; H01R 12/714; H05K 7/1069
(Continued)

(56) References Cited

U.S. PATENT DOCUMENTS 2,894,303 A * 7/1959 Armstrong ................ A47F 3/12
211/184
6,019,611 A * 2/2000 McHugh ............ H01R 13/2435
439/515
(Continued)

FOREIGN PATENT DOCUMENTS

CN 1096723 C 12/2002
CN 2706902 Y 6/2005
(Continued)

*Primary Examiner* — Abdullah A Riyami
*Assistant Examiner* — Vladimir Imas
(74) *Attorney, Agent, or Firm* — Locke Lord LLP; Tim Tingkang Xia, Esq.

(57) ABSTRACT

An electrical connector for electrically connecting a chip module to a circuit board includes: a body, configured to upward support the chip module, where the body is provided with a plurality of accommodating holes; and multiple terminals, respectively accommodated in the accommodating holes correspondingly. Each of the terminals includes a flat plate portion along a vertical direction and a connecting portion connected to the flat plate portion. An elastic arm is formed by bending and extending from at least one end of the connecting portion so as to abut the chip module or the circuit board. When the chip module presses the terminal downward, a side edge of the elastic arm abuts the flat plate portion. The structure of an elastic arm can be simplified to reduce the processing difficulty thereof.

20 Claims, 22 Drawing Sheets

(51) Int. Cl.
*H01R 13/24* (2006.01)
*H01R 12/52* (2011.01)
*H01R 12/57* (2011.01)
*H01R 13/6461* (2011.01)
*H01R 12/70* (2011.01)
*H05K 7/10* (2006.01)
*H01R 12/73* (2011.01)
*H01R 13/41* (2006.01)

(52) U.S. Cl.
CPC ....... *H01R 12/7076* (2013.01); *H01R 12/714* (2013.01); *H01R 12/73* (2013.01); *H01R 13/245* (2013.01); *H01R 13/2407* (2013.01); *H01R 13/2435* (2013.01); *H01R 13/2457* (2013.01); *H01R 13/2464* (2013.01); *H01R 13/6461* (2013.01); *H05K 7/1069* (2013.01); *H01R 13/41* (2013.01); *H05K 2201/10325* (2013.01)

(58) Field of Classification Search
USPC .......................................................... 439/66
See application file for complete search history.

(56) References Cited

U.S. PATENT DOCUMENTS

| | | | | |
|---|---|---|---|---|
| 6,695,624 B1* | 2/2004 | Szu | ...................... | H05K 7/1069 439/342 |
| 6,749,440 B1* | 6/2004 | Szu | ................... | H01R 13/2435 439/515 |
| 7,052,284 B2* | 5/2006 | Liao | ................... | H01R 13/2435 439/66 |
| 7,059,873 B2* | 6/2006 | Johnescu | ........... | H01R 13/2435 439/444 |
| 7,094,062 B2* | 8/2006 | Ramey | ............... | H01R 13/2442 439/66 |
| 7,303,421 B2* | 12/2007 | Liao | ......................... | H01R 4/02 439/342 |
| 7,390,195 B2* | 6/2008 | Liao | ................... | H01R 13/2435 439/66 |
| 7,527,536 B2* | 5/2009 | Chiang | ................... | H01R 12/57 439/884 |
| 7,559,811 B1* | 7/2009 | Polnyi | ................. | H01R 4/4809 439/591 |
| 7,563,105 B2* | 7/2009 | Liu | .................... | H01R 13/2492 439/66 |
| 7,625,217 B1* | 12/2009 | Liao | ..................... | H01R 12/714 439/66 |
| 7,628,661 B2* | 12/2009 | Liao | ........................ | H01R 12/57 439/862 |
| 7,791,443 B1* | 9/2010 | Ju | ........................... | H01R 12/52 336/107 |
| 7,857,632 B2* | 12/2010 | Liu | ................... | H01R 13/2492 439/66 |
| 7,878,823 B2* | 2/2011 | Fan | ....................... | H01R 12/58 439/83 |
| 7,896,678 B2* | 3/2011 | Zhang | .................... | H01R 12/57 439/342 |
| 7,972,144 B2* | 7/2011 | Chang | ..................... | H01R 4/02 439/66 |
| 7,988,501 B2* | 8/2011 | Chang | .................. | H05K 7/1069 439/751 |
| 8,096,836 B2* | 1/2012 | Cheng | .................. | H01R 13/2435 439/626 |
| 8,118,603 B2* | 2/2012 | Ho | ......................... | H01R 12/57 439/626 |
| 8,147,256 B2* | 4/2012 | Jin | .......................... | H01R 12/52 439/83 |
| 8,215,998 B1* | 7/2012 | Ju | ....................... | H01R 12/7076 439/626 |
| 8,235,734 B2* | 8/2012 | Ju | .......................... | H01R 12/57 439/83 |
| 8,277,230 B2* | 10/2012 | Huo | ..................... | H01R 12/716 439/342 |
| 8,323,038 B2* | 12/2012 | Jin | ......................... | H01R 12/714 439/66 |
| 8,366,453 B2* | 2/2013 | Chang | .................... | H01R 12/58 439/66 |
| 8,684,775 B2* | 4/2014 | Liu | ...................... | H05K 7/1069 439/862 |
| 8,708,716 B1* | 4/2014 | Ho | ....................... | H01R 12/714 439/83 |
| 8,851,904 B2* | 10/2014 | Chang | ................... | H01R 12/71 439/607.03 |
| 9,437,948 B2* | 9/2016 | Ju | ...................... | H01R 12/7076 |
| 9,917,386 B1* | 3/2018 | Ju | ......................... | H01R 12/52 |
| 2004/0009694 A1* | 1/2004 | Lai | ......................... | H01R 12/88 439/342 |
| 2004/0219805 A1* | 11/2004 | Ju | ...................... | H01R 13/2485 439/66 |
| 2005/0045363 A1* | 3/2005 | Ju | ......................... | H01R 12/57 174/94 R |
| 2007/0128917 A1* | 6/2007 | Ho | ....................... | H05K 7/1053 439/331 |
| 2008/0124957 A1* | 5/2008 | Liao | ................... | H01R 13/2442 439/83 |
| 2008/0160841 A1* | 7/2008 | Polnyi | ................ | H01R 13/2435 439/842 |
| 2009/0263985 A1* | 10/2009 | Liu | ................... | H01R 13/2457 439/66 |
| 2010/0216344 A1* | 8/2010 | Fan | ....................... | H01R 12/52 439/626 |
| 2011/0014823 A1* | 1/2011 | Lin | .................... | H01R 13/2421 439/786 |
| 2012/0028502 A1* | 2/2012 | Yeh | ....................... | H01R 12/57 439/626 |
| 2012/0196481 A1* | 8/2012 | Ju | ....................... | H01R 13/6588 439/626 |
| 2013/0237090 A1* | 9/2013 | Chang | ................ | H01R 13/6586 439/607.01 |
| 2013/0267124 A1* | 10/2013 | Chang | ................... | H01R 13/646 439/630 |
| 2014/0038438 A1* | 2/2014 | Chang | ................... | H01R 12/71 439/76.1 |
| 2014/0080327 A1* | 3/2014 | Hwang | ............. | H01R 13/6585 439/65 |

FOREIGN PATENT DOCUMENTS

| | | |
|---|---|---|
| CN | 2706906 Y | 6/2005 |
| CN | 2884576 Y | 3/2007 |
| CN | 101283488 B | 6/2011 |

\* cited by examiner

ELECTRICAL CONNECTOR

CROSS-REFERENCE TO RELATED PATENT APPLICATION

This non-provisional application claims priority to and the benefit of, pursuant to 35 U.S.C. § 119(e), U.S. provisional patent application Ser. No. 62/445,396 filed Jan. 12, 2017 and under 35 U.S.C. § 119(a), patent application Serial No. CN201710678582.2 filed in China on Aug. 10, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector which electrically connects a chip module to a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

China Patent No. CN200420026548.5 discloses an electrical connector terminal, which is used for electrically connecting a chip module and a circuit board. The electrical connector terminal includes a base, first and second elastic arms extending from two opposite sides of the base, first and second conducting portions respectively protrudingly provided at tail ends of the first and second elastic arms, and first and second short arms bending and extending toward each other from the first and second conducting portions respectively. The first and second short arms directly face each other and are spaced from each other, and free ends thereof are symmetrically provided with first and second contact portions distant from each other.

When the chip module completely presses downward, the electrical connector terminal is elastically deformed under the action of extrusion, the first and second conducting portions are conducted with conductive sheets of the chip module and the circuit board respectively. The first and second elastic arms and the first and second short arms are close to each other, and the first and second contact portions of the first and second short arms move toward each other and are elastically pressed against each other, so as to form, between the chip module and the circuit board, a first conductive path sequentially passing through the chip module, the first conducting portion, the first elastic arm, the base, the second elastic arm, the second conducting portion and the circuit board, and a shortened second conductive path sequentially passing through the chip module, the first conducting portion, the first short arm, the second short arm, the second conducting portion and the circuit board. The shortened second conductive path and the first conductive path are disposed in parallel, have a smaller self-induction effect, and reduce electrical impedance during telecommunication transmission between the chip module and the circuit board, thereby ensuring good electrical conduction and telecommunication transmission properties between the chip module and the circuit board.

However, since a plate surface of the first short arm is pressed against a plate surface of the second short arm, the first and second short arms need to bend reversely for a large angle from the first and second conducting portions, thereby making it relatively difficult to machine and form this structure. Moreover, in the presence of an acting force in a vertical direction therebetween when the first and second short arms are elastically pressed against each other, it is necessary to exert a large pressure to make the chip module press a terminal downward, and under-pressure may cause an unstable contact between the first and second short arms, so that a second conductive path cannot be stably formed, and a strong electrical impedance still exists during telecommunication transmission between the chip module and the circuit board.

Therefore, a heretofore unaddressed need to design a novel electrical connector exists in the art to address the aforementioned deficiencies and inadequacies.

SUMMARY

An objective of the present invention is to provide an electrical connector which stably provides two parallel conductive paths so as to reduce electrical impedance during telecommunication transmission between a chip module and a circuit board.

To achieve the foregoing objective, the present invention adopts the following technical solutions.

An electrical connector, configured to electrically connect a chip module to a circuit board, including: a body, configured to upward support the chip module, wherein the body is provided with a plurality of accommodating holes; and a plurality of terminals, respectively accommodated in the accommodating holes correspondingly, each of the terminals comprising a flat plate portion along a vertical direction and a connecting portion connected to the flat plate portion, wherein an elastic arm is formed by bending and extending from at least one end of the connecting portion so as to abut the chip module or the circuit board, and when the chip module presses the terminal downward, a side edge of the elastic arm abuts the flat plate portion.

In certain embodiments, the flat plate portion is formed by extending from one side of the connecting portion, a position limiting portion is formed by extending from an opposite side of the connecting portion, and each of the accommodating holes is protrudingly provided with a first protruding block on one side surface thereof and located below the position limiting portion so as to limit the corresponding terminal from moving downward.

In certain embodiments, the flat plate portion, the connecting portion and the position limiting portion are located on a same vertical plane.

In certain embodiments, the flat plate portion has a stopping portion located higher than a connecting position between the flat plate portion and the connecting portion, each of the accommodating holes has a stopping surface located below the stopping portion so as to limit the corresponding terminal from moving downward, and the elastic arm abuts a side of the flat plate portion away from the stopping portion.

In certain embodiments, the flat plate portion has a hook portion located lower than a connecting position between the flat plate portion and the connecting portion, each of the accommodating holes is protrudingly provided with a second protruding block on one side surface thereof and is located above the hook portion so as to limit the corresponding terminal from moving upward, and the elastic arm abuts a side of the flat plate portion away from the hook portion.

In certain embodiments, a side edge of the elastic arm is protrudingly provided with an abutting portion, and a side edge of the abutting portion abuts the flat plate portion.

In certain embodiments, there are two elastic arms, defined as a first elastic arm and a second elastic arm; the first elastic arm is formed by bending and extending upward from an upper end of the connecting portion and is configured to abut the chip module, and the second elastic arm is formed by bending and extending downward from a lower end of the connecting portion and is configured to abut the circuit board; a side edge of the first elastic arm is protrudingly provided with a first abutting portion; and when the chip module presses the first elastic arm downward, the first elastic arm and the second elastic arm abut each other, and the first abutting portion is located higher than an abutting position between the first elastic arm and the second elastic arm.

In certain embodiments, a side edge of the second elastic arm is protrudingly provided with a second abutting portion, and the second abutting portion of the second elastic arm is located lower than the abutting position between the first elastic arm and the second elastic arm.

In certain embodiments, the connecting portion is perpendicular to the flat plate portion, two elastic arms are formed by bending and extending from two opposite ends of the connecting portion respectively, and the two elastic arms are located on a same side of a vertical plane where the flat plate portion is located.

In certain embodiments, each of the elastic arms extends from one of the ends of the connecting portion toward a direction away from a vertical plane where the connecting portion is located, and then reversely bends and extends across the vertical plane where the connecting portion is located, and the two elastic arms are symmetrically disposed.

In certain embodiments, the elastic arm has an abutting portion abutting the flat plate portion, and a width of the elastic arm is gradually reduced from the abutting portion to a free end of the elastic arm, such that a guide chamfer is formed at a side edge of the elastic arm so as to guide the abutting portion to abut the flat plate portion.

In certain embodiments, the flat plate portion comprises a base, an extending portion extending from one side of the base and connected to the connecting portion, and a blocking portion protruding from an opposite side of the base, and each of the accommodating holes is protrudingly provided with a third protruding block and a fourth protruding block on one side surface thereof and are correspondingly located below the blocking portion and the extending portion so as to limit the corresponding terminal from moving downward.

In certain embodiments, two barbs are formed on two opposite sides of a bottom end of the base and are located below the third protruding block and the fourth protruding block, and one side of the third protruding block and one side of the fourth protruding block are respectively provided with an inclined surface so as to guide the barbs.

In certain embodiments, a height of the extending portion is between upper and lower edges of the blocking portion.

In certain embodiments, a side edge of the elastic arm abuts a plate surface of the flat plate portion.

In certain embodiments, a side edge of the elastic arm abuts a plate edge of the flat plate portion.

In certain embodiments, each of the terminals further comprises a bonding portion, the bonding portion and the connecting portion are formed by bending and extending from two opposite sides of the flat plate portion respectively, the bonding portion and the connecting portion are located on a same side of a vertical plane where the flat plate portion is located, an upper arm is formed by bending and extending upward from a top end of the bonding portion, the elastic arm is formed by bending and extending upward from the top end of the connecting portion and is configured to abut the chip module upward, and when the chip module presses the elastic arm downward, the elastic arm abuts the upper arm.

In certain embodiments, a free end of the elastic arm extends across a vertical plane where the bonding portion is located, and the free end of the elastic arm abuts the upper arm.

An electrical connector, configured to electrically connect a chip module to a circuit board, including: a body, configured to upward support the chip module, wherein the body is provided with a plurality of accommodating holes; and a plurality of terminals, respectively accommodated in the accommodating holes correspondingly, each of the terminals comprising a flat plate portion and a connecting portion connected to the flat plate portion, wherein the flat plate portion is disposed along a vertical direction and configured to be connected to a strip, an elastic arm is formed by bending and extending from at least one end of the connecting portion so as to abut the chip module or the circuit board, and when the chip module presses the terminal downward, the elastic arm abuts the flat plate portion.

An electrical connector, configured to be electrically connected with a chip module, including: a body, configured to upward support the chip module, wherein the body is provided with a plurality of accommodating holes; and a plurality of terminals, respectively accommodated in the accommodating holes correspondingly, each of the terminals comprising a flat plate portion and a connecting portion connected to the flat plate portion, wherein the flat plate portion is configured to be connected to a strip, an elastic arm is formed by bending and extending from the connecting portion so as to abut the chip module, and when the chip module presses the terminal downward, the elastic arm abuts the flat plate portion.

Compared with the related art, the electrical connector according to certain embodiments of the present invention has the following beneficial effects.

When the chip module presses the terminals downward, a side edge of the elastic arm abuts the flat plate portion, so that the structure of the elastic arm can be simplified to reduce the processing difficulty thereof. Moreover, an abutting force between the elastic arm and the flat plate portion is not in a vertical direction, so the pressure of the chip module on the terminal does not influence abutting between the elastic arm and the flat plate portion. Therefore, two parallel conductive paths can be stably formed, thereby reducing electrical impedance during telecommunication transmission between the chip module and the circuit board. Moreover, a side edge of the elastic arm abuts the flat plate portion, so that oxidation layers formed on the elastic arm and the flat plate portion can be scraped off, and an abutting effect between the elastic arm and the flat plate portion is enhanced, thereby ensuring a good electrical connection between the chip module and the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
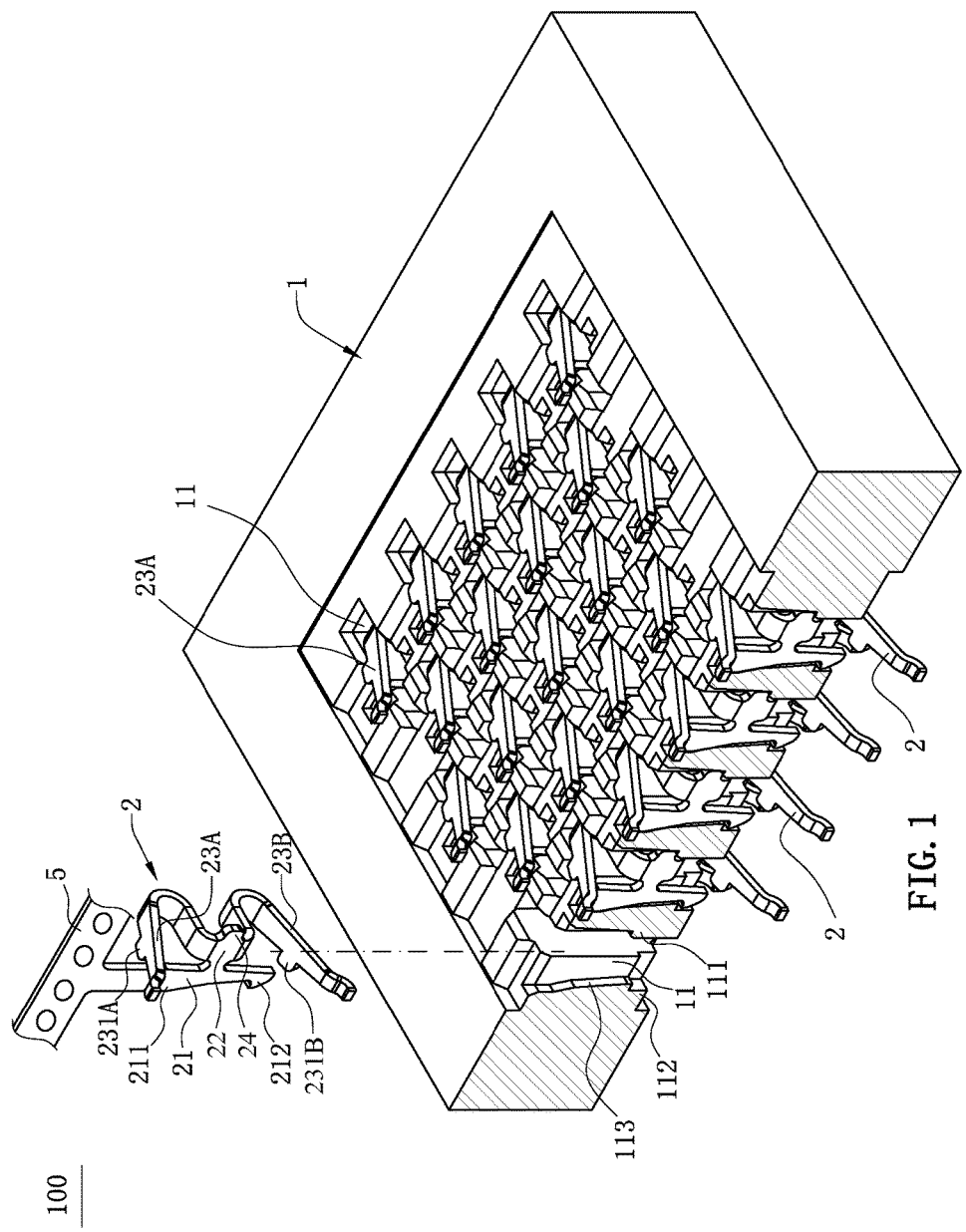
FIG. 1 is a perspective view of an electrical connector according to a first embodiment of the present invention before a chip module is pressed downward.
Figure 2:
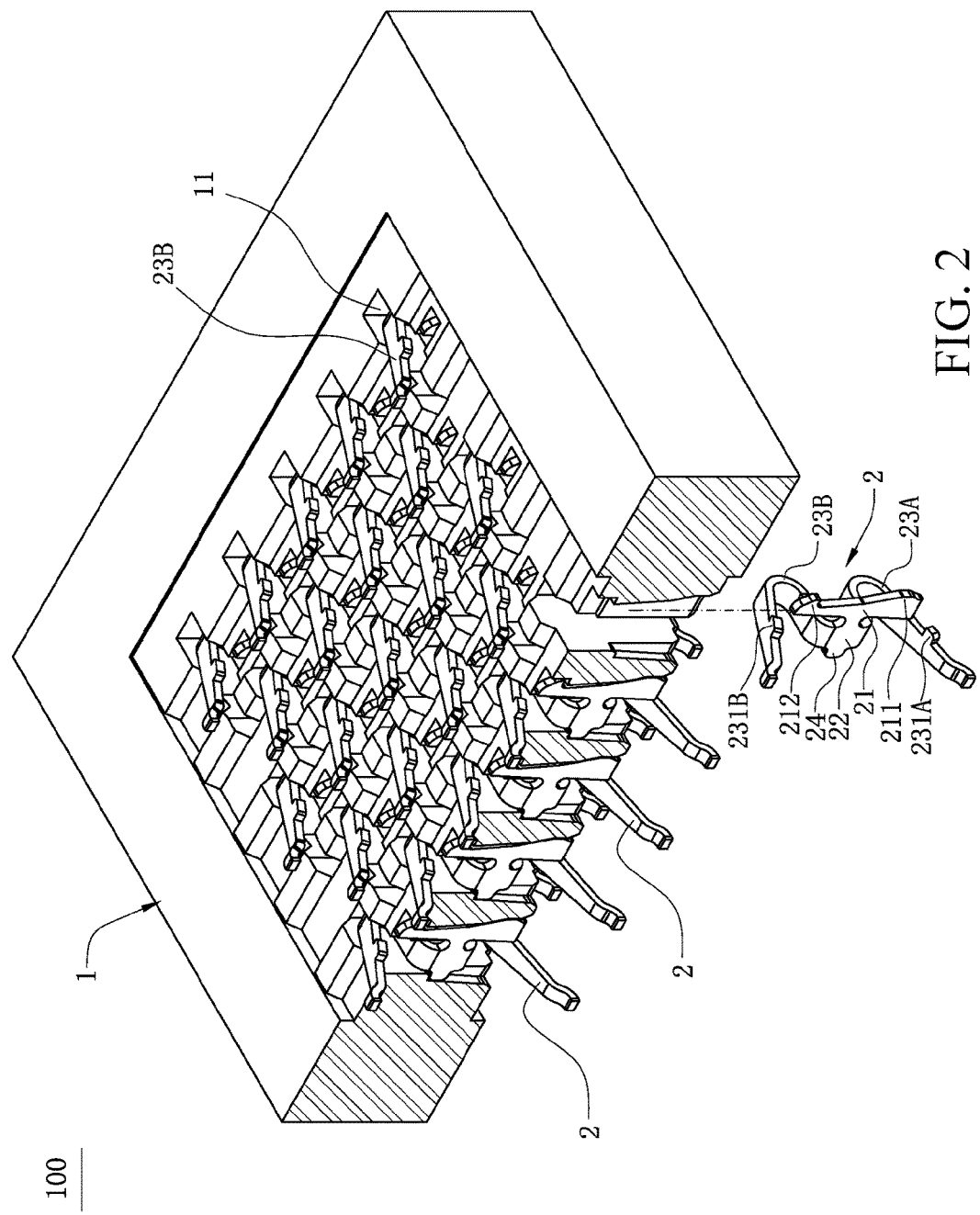
FIG. 2 is a perspective view of an electrical connector in FIG. 1 that vertically rotates by 180°.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-22. In accordance with the purposes of this invention, as embodied and broadly described herein, this invention, in one aspect, relates to an electrical connector.

As shown in FIG. 1 to FIG. 6, an electrical connector 100 according to a first embodiment of the present invention is configured to electrically connect a chip module 3 to a circuit board 4, and includes a body 1 configured to upward support the chip module 3 and multiple terminals 2 respectively accommodated in the body 1.

Figure 3:
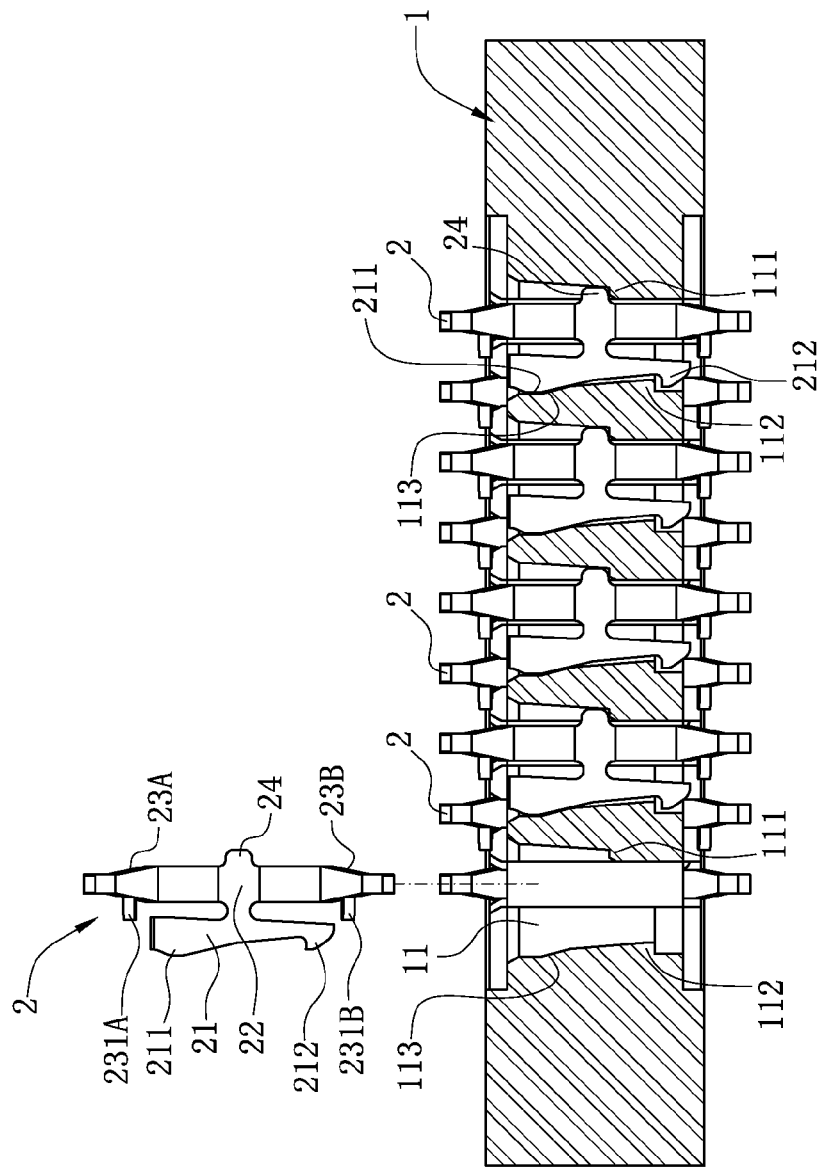
FIG. 3 is a front view of FIG. 1.

As shown in FIG. 1 and FIG. 3, the body 1 is provided with multiple accommodating holes 11 running through the body 1 vertically. Each of the accommodating holes 11 is protrudingly provided with a first protruding block 111 on one side surface thereof, and each of the accommodating holes 11 is protrudingly provided with a second protruding block 112 on an opposite side surface thereof. Furthermore, each of the accommodating holes 11 is also provided with a stopping surface 113 located right above the second protruding block 112.

The terminals 2 are respectively accommodated in the accommodating holes 11 correspondingly. Each terminal 2 includes a flat plate portion 21 along a vertical direction, and a connecting portion 22 connected to the flat plate portion 21. The flat plate portion 21 is formed by extending from one side of the connecting portion 22, and a position limiting portion 24 is formed by extending from an opposite side of the connecting portion 22. The flat plate portion 21, the connecting portion 22 and the position limiting portion 24 are located on a same vertical plane. The first protruding block 111 is located below the position limiting portion 24 so as to limit the terminal 2 from moving downward.

The flat plate portion 21 has a stopping portion 211 located higher than a connecting position between the flat plate portion 21 and the connecting portion 22, and the stopping surface 113 is located below the stopping portion 211 so as to limit the terminal 2 from moving downward. The flat plate portion 21 has a hook portion 212 located lower than the connecting position between the flat plate portion 21 and the connecting portion 22, and the second protruding block 112 is located above the hook portion 212 so as to limit the terminal 2 from moving upward. A top end of the flat plate portion 21 is configured to be connected to a strip 5, and is located lower than a top surface of the corresponding accommodating hole 11.

Each terminal 2 further includes a first elastic arm 23A, which extends from an upper end of the connecting portion 22 toward a direction away from a vertical plane where the connecting portion 22 is located, and then reversely bends and extends across the vertical plane where the connecting portion 22 is located, and is configured to abut the chip module 3; and a second elastic arm 23B, which extends from a lower end of the connecting portion 22 to a direction away from the vertical plane where the connecting portion 22 is located and then reversely bends and extends across the vertical plane where the connecting portion 22 is located, and is configured to abut the circuit board 4. The second elastic arm 23B and the first elastic arm 23A are symmetrically disposed (in other embodiments, only the first elastic arm 23A may be provided, and in this case, the terminal 2 is soldered to the circuit board 4).

Figure 4:
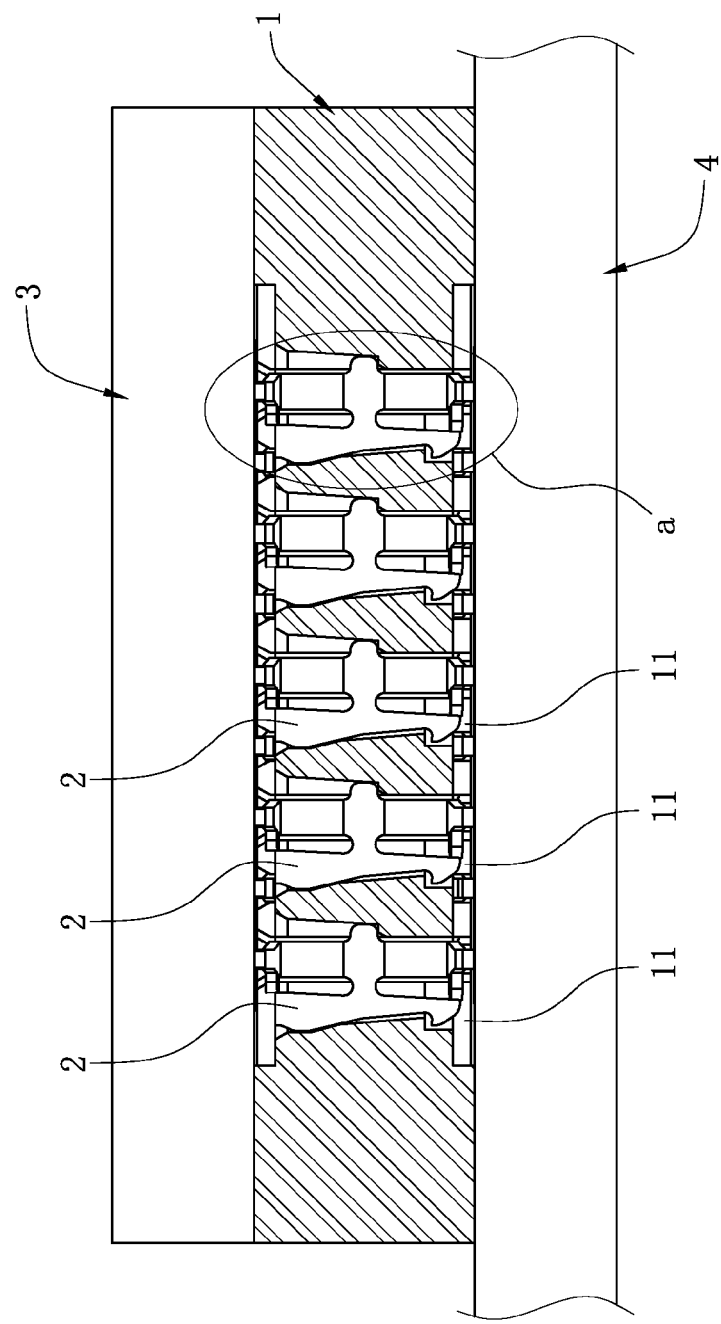
FIG. 4 is a plain view of an electrical connector in FIG. 3 after a chip module is pressed downward.
Figure 5:
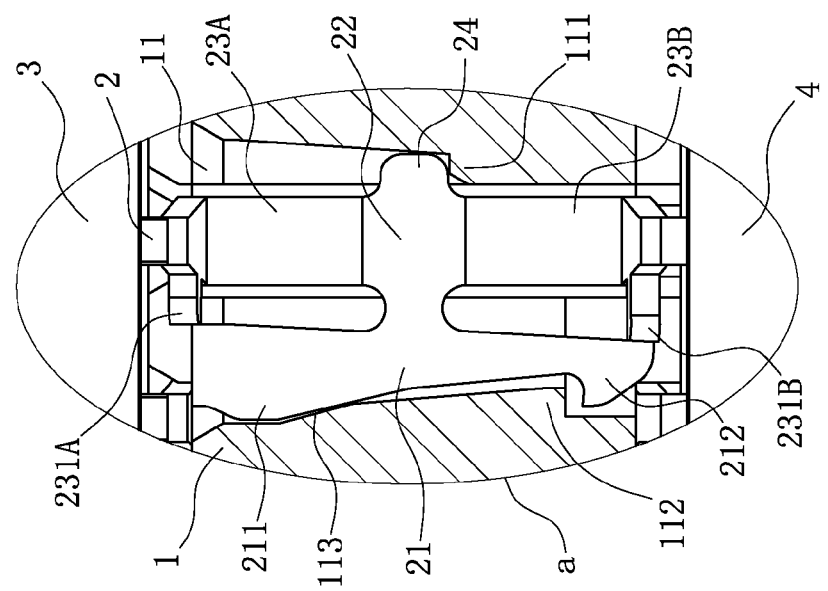
FIG. 5 is an enlarged view of a part a in FIG. 4.

As shown in FIG. 1, FIG. 4 and FIG. 5, a side edge of the first elastic arm 23A is protrudingly provided with a first abutting portion 231A, and a side edge of the first abutting portion 231A abuts a side of the flat plate portion 21 away from the stopping portion 211. A side edge of the second elastic arm 23B is protrudingly provided with a second abutting portion 231B, and a side edge of the second abutting portion 231B abuts a side of the flat plate portion 21 away from the hook portion 212.

Figure 6:
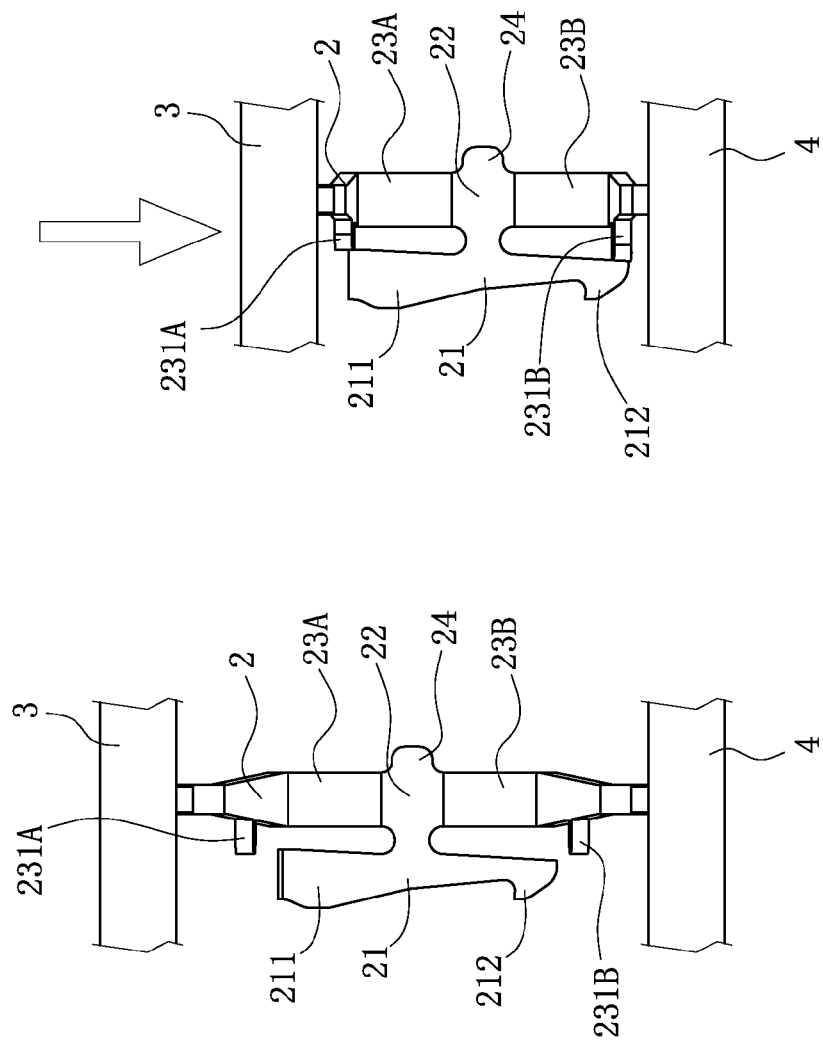
FIG. 6 is a schematic view of a terminal in FIG. 3 before and after a chip module is pressed downward.
Figure 7:
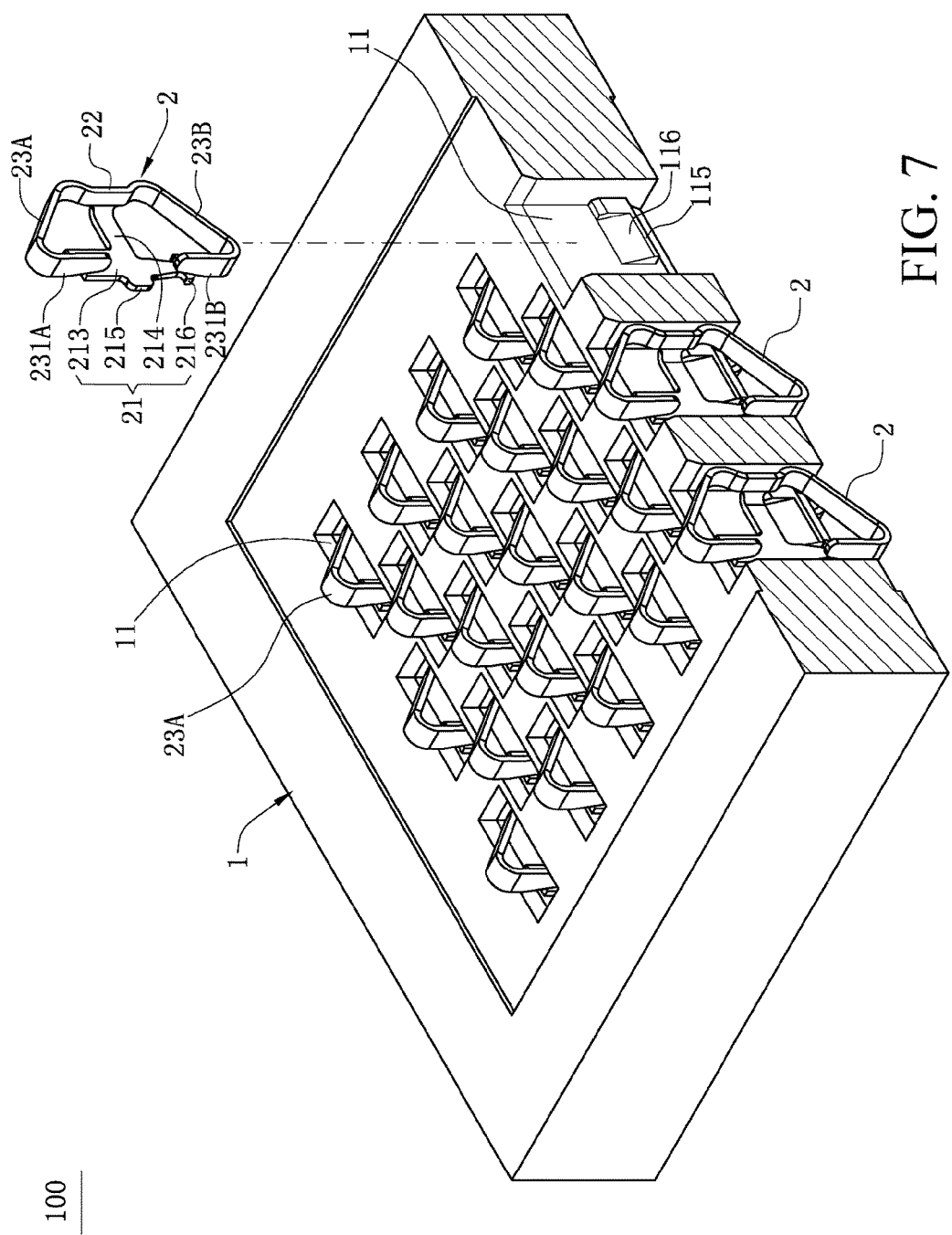
FIG. 7 is a perspective view of an electrical connector according to a second embodiment of the present invention before a chip module is pressed downward.
Figure 8:
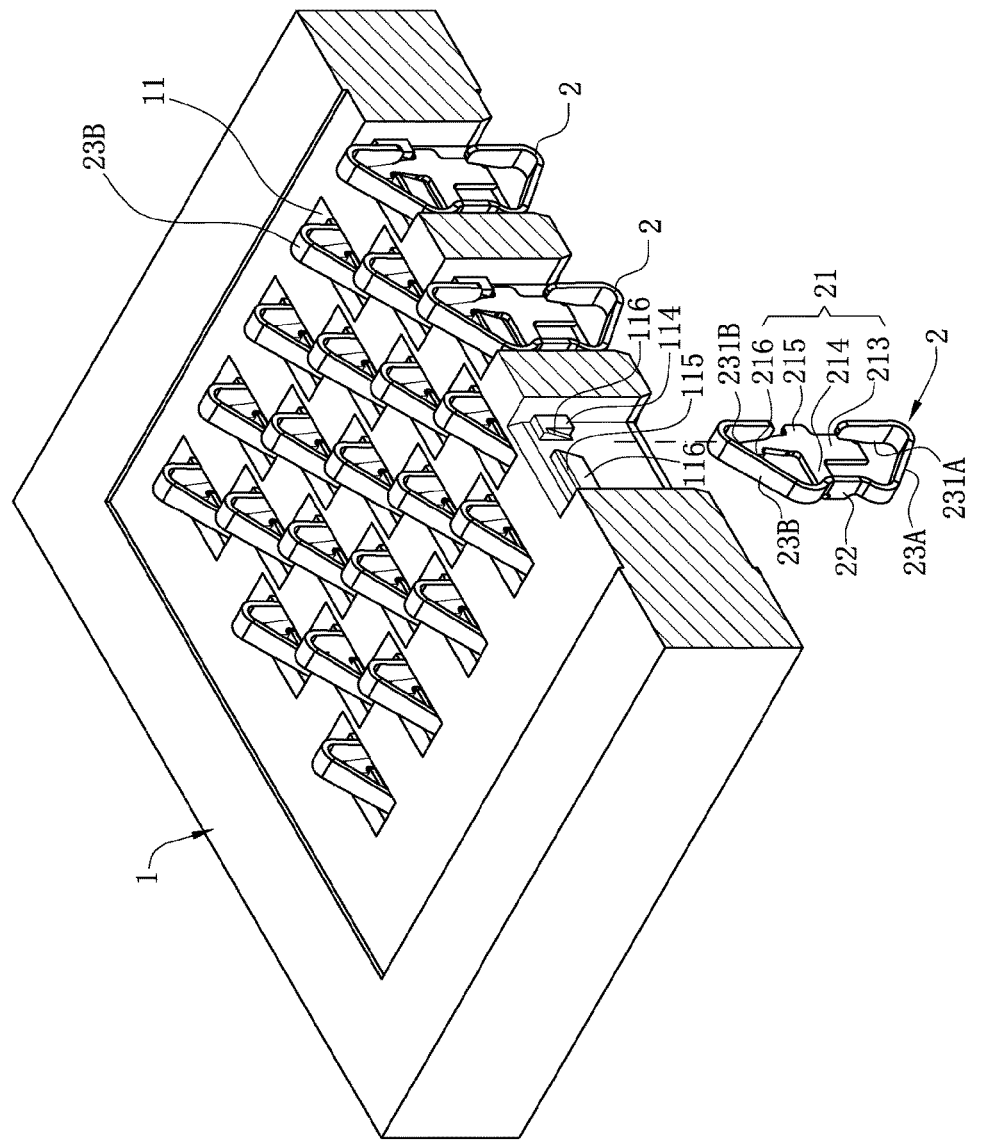
FIG. 8 is a perspective view of an electrical connector in FIG. 7 that vertically rotates by 180°.
Figure 9:
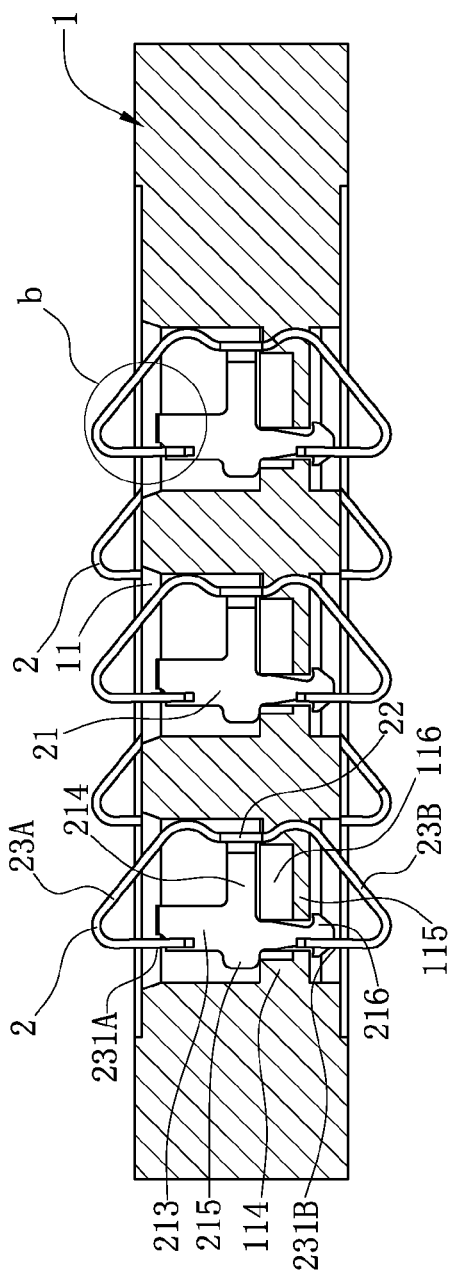
FIG. 9 is a side view of FIG. 7.
Figure 10:
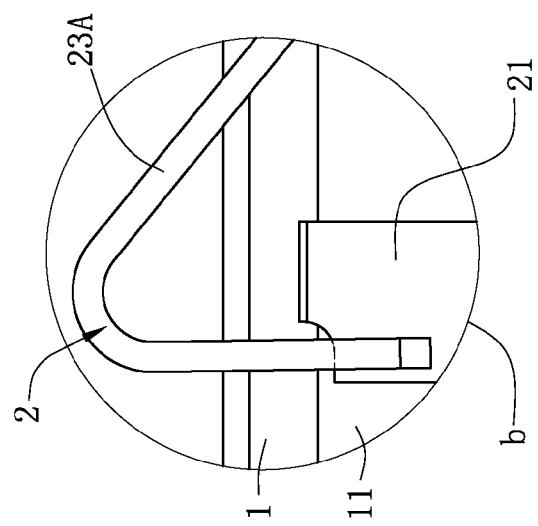
FIG. 10 is an enlarged view of a part b in FIG. 9.
Figure 11:
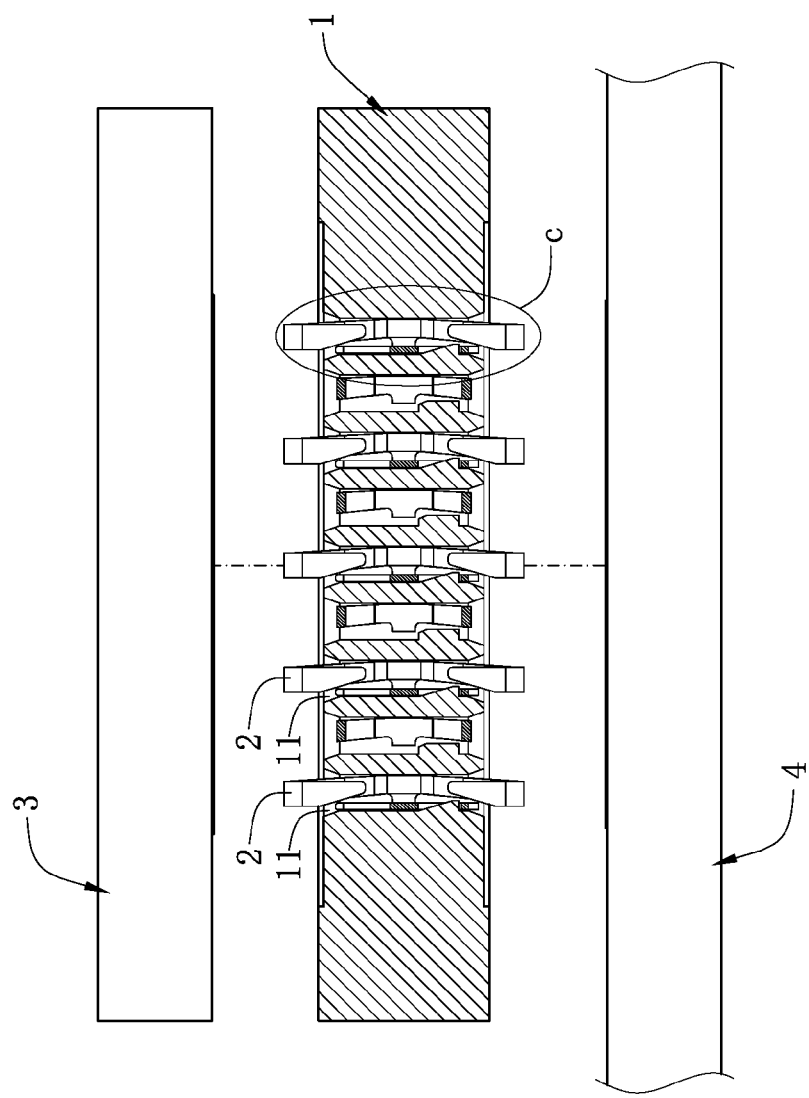
FIG. 11 is a sectional view of an electrical connector in FIG. 7 from another angle before a chip module is pressed downward.
Figure 12:
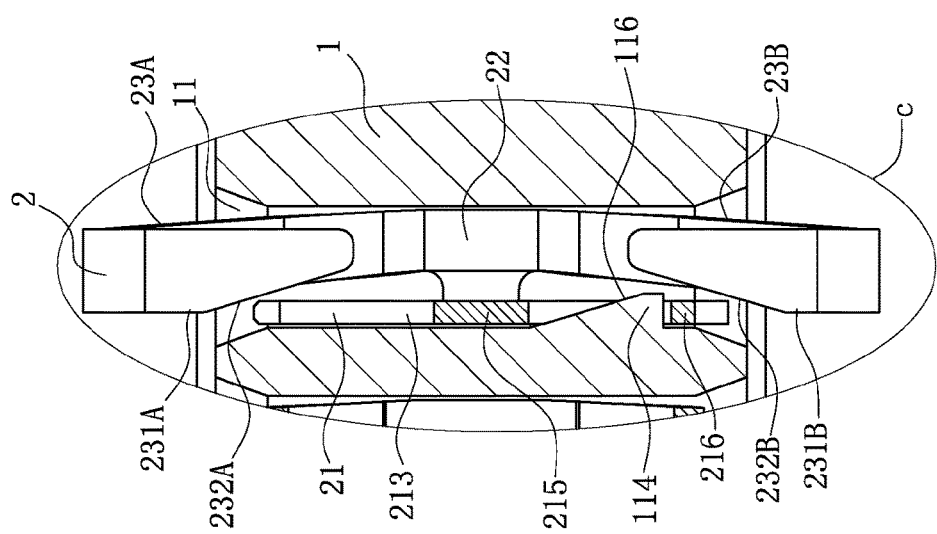
FIG. 12 is an enlarged view of a part c in FIG. 11.
Figure 13:
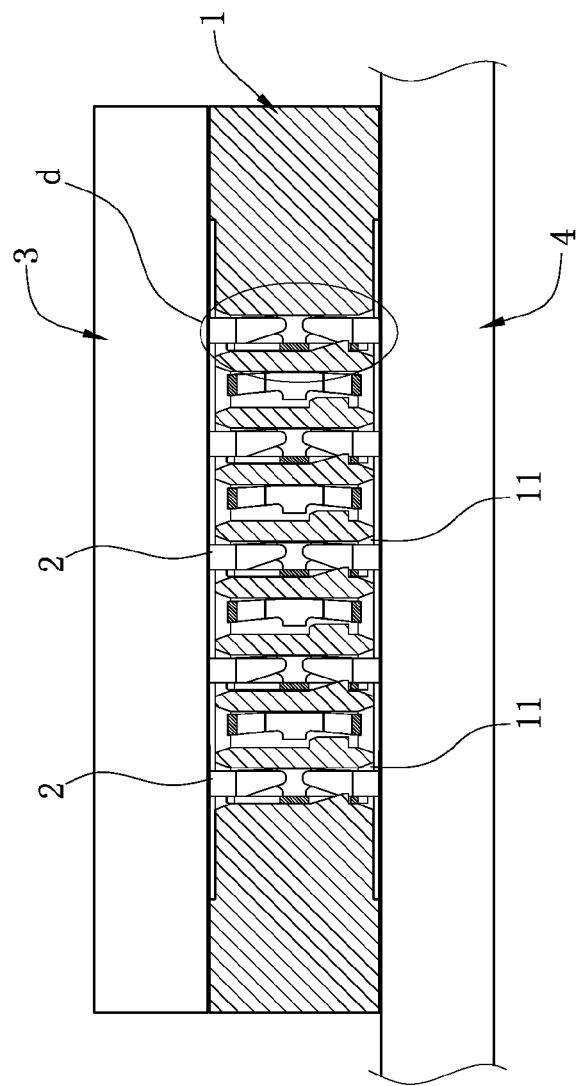
FIG. 13 is a plain view of an electrical connector in FIG. 11 after a chip module is pressed downward.
Figure 14:
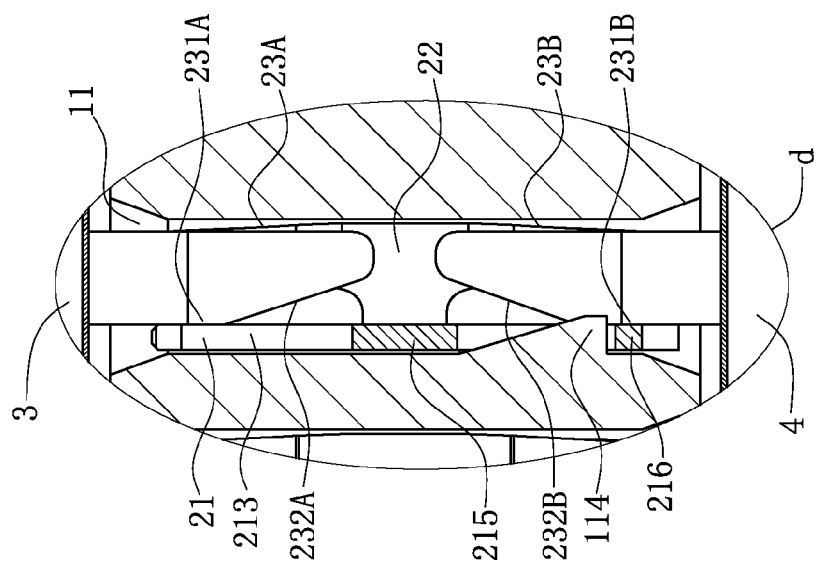
FIG. 14 is an enlarged view of a part d in FIG. 13.

As shown in FIG. 6, when the chip module 3 presses the first elastic arm 23A downward, the first elastic arm 23A and the second elastic arm 23B are close to each other, and the side edges of the first abutting portion 231A and the second abutting portion 231B abut a plate edge of the flat plate portion 21 (in other embodiments, before the chip module 3 presses downward, the first abutting portion 231A and the second abutting portion 231B may keep in contact with the flat plate portion 21), so as to form, between the chip module 3 and the circuit board 4, a conductive path which sequentially passes through the chip module 3, the first elastic arm 23A, the connecting portion 22, the second elastic arm 23B and the circuit board 4, and another conductive path which sequentially passes through the chip module 3, the first elastic arm 23A, the first abutting portion 231A, the flat plate portion 21, the second abutting portion 231B, the second elastic arm 23B and the circuit board 4, which are parallel to each other, thereby reducing impedance and self-induction effect during signal transmission, and providing good electrical conduction and signal transmission properties between the chip module 3 and the circuit board 4.

FIG. 7 to FIG. 14 show an electrical connector 100 according to a second embodiment of the present invention, which is different from the first embodiment in the features characterized as follows.

In the second embodiment, the first abutting portion 231A does not protrude from the side edge of the first elastic arm 23A, and a width of the first elastic arm 23A is gradually reduced from the first abutting portion 231A to a free end thereof, such that a first guide chamfer 232A is formed at the side edge of the first elastic arm 23A so as to guide the side edge of the first abutting portion 231A to abut a plate surface of the flat plate portion 21.

The second abutting portion 231B does not protrude from the side edge of the second elastic arm 23B, and a width of the second elastic arm 23B is gradually reduced from the second abutting portion 231B to a free end thereof, such that a second guide chamfer 232B is formed at the side edge of the second elastic arm 23B so as to guide the side edge of the second abutting portion 231B to abut a plate surface of the flat plate portion 21.

The connecting portion 22 is perpendicular to the flat plate portion 21, and the first elastic arm 23A and the second elastic arm 23B are located on a same side of a vertical plane where the flat plate portion 21 is located.

The flat plate portion 21 includes a base 213, an extending portion 214 extending from one side of the base 213 and connected to the connecting portion 22, and a blocking portion 215 protruding from an opposite side of the base 213. Each of the accommodating holes 11 is protrudingly provided with a third protruding block 114 and a fourth protruding block 115 on one side surface thereof and are correspondingly located below the blocking portion 215 and the extending portion 214 so as to limit the terminal 2 from moving downward. A height of the extending portion 214 is between upper and lower edges of the blocking portion 215.

Two barbs 216 are formed on two opposite sides of a bottom end of the base 213 and are located below the third protruding block 114 and the fourth protruding block 115. One side of the third protruding block 114 and one side of the fourth protruding block 115 are respectively provided with an inclined plane 116 so as to guide the barbs 216.

Figure 15:
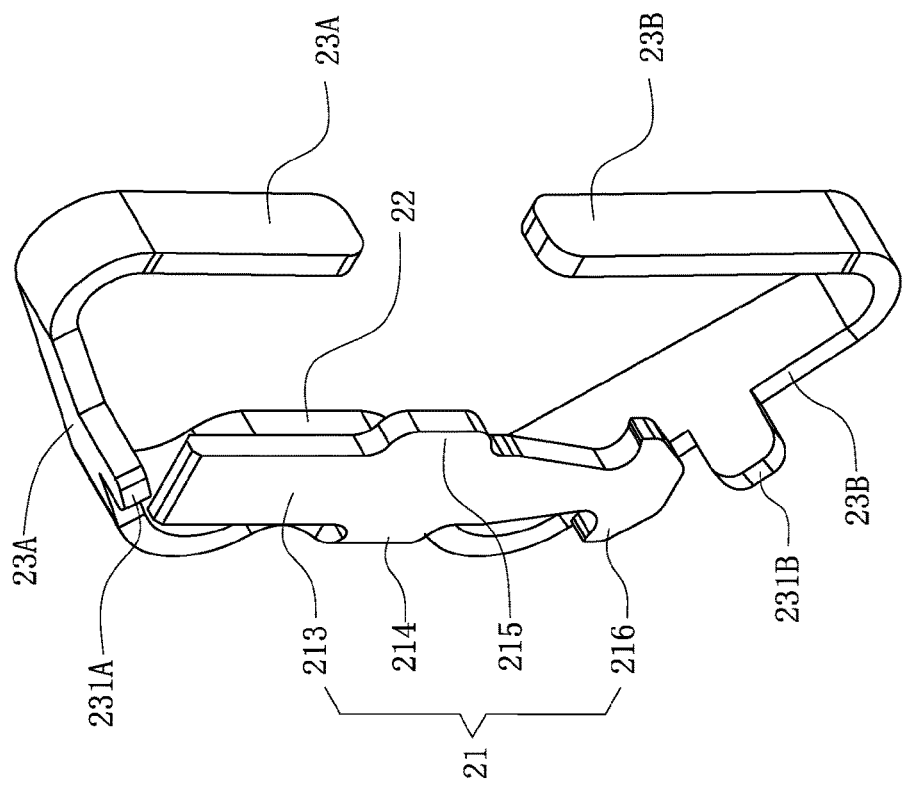
FIG. 15 is a perspective view of a terminal of an electrical connector according to a third embodiment of the present invention.
Figure 16:
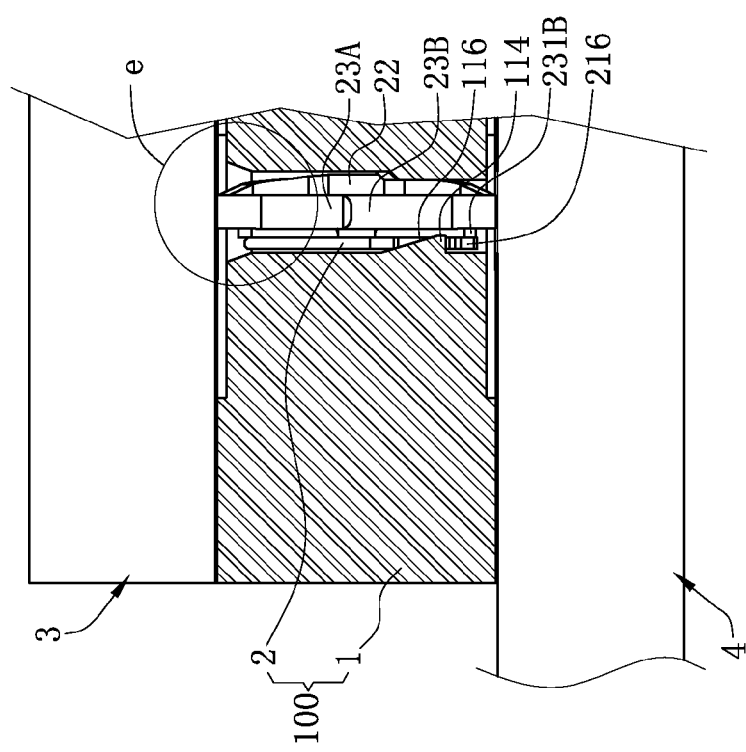
FIG. 16 is a sectional view of an electrical connector in FIG. 15 after a chip module is pressed downward.
Figure 17:
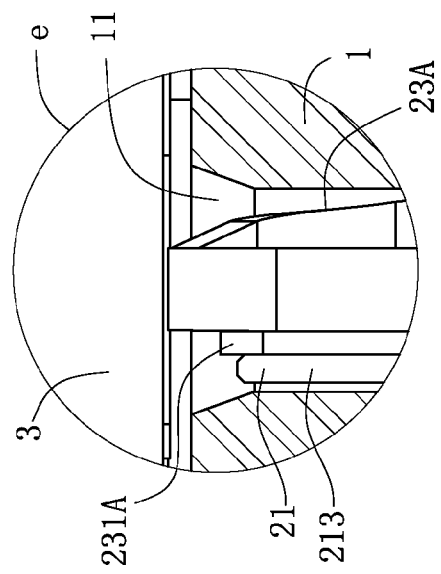
FIG. 17 is an enlarged view of a part e in FIG. 16.

FIG. 15 to FIG. 17 show an electrical connector 100 according to a third embodiment of the present invention, which is different from the second embodiment in the features characterized as follows.

In the third embodiment, the first abutting portion 231A is protrudingly disposed at the side edge of the first elastic arm 23A, and the second abutting portion 231B is protrudingly disposed at the side edge of the second elastic arm 23B.

When the chip module 3 presses the first elastic arm 23A downward, a free end of the first elastic arm 23A abuts a plate surface of the second elastic arm 23B. The first abutting portion 231A is located higher than an abutting position between the first elastic arm 23A and the second elastic arm 23B, and the second abutting portion 231B is located lower than the abutting position between the first elastic arm 23A and the second elastic arm 23B, so as to form, between the chip module 3 and the circuit board 4, a third parallel conductive path which sequentially passes through the chip module 3, the first elastic arm 23A, the second elastic arm 23B and the circuit board 4, so that impedance and self-induction effect during signal transmission can be further reduced.

Figure 18:
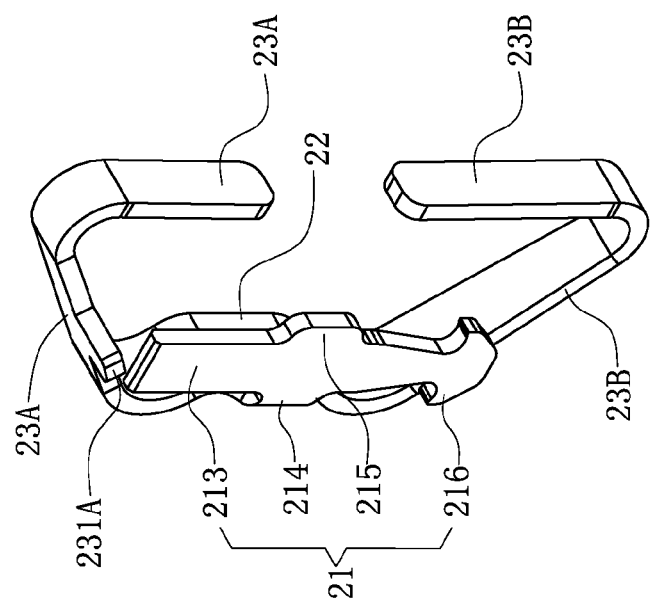
FIG. 18 is a perspective view of a terminal of an electrical connector according to a fourth embodiment of the present invention.

FIG. 18 shows an electrical connector 100 according to a fourth embodiment of the present invention, which is different from the third embodiment in that the second elastic arm 23B is not provided with the second abutting portion 231B.

Figure 19:
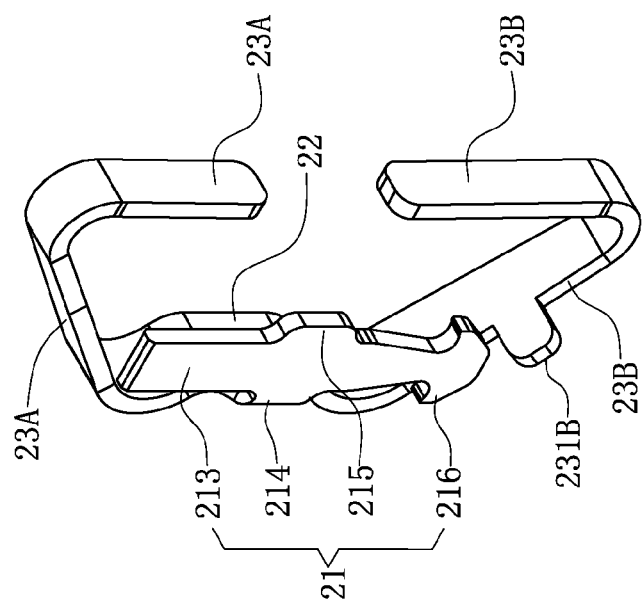
FIG. 19 is a perspective view of a terminal of an electrical connector according to a fifth embodiment of the present invention.

FIG. 19 shows an electrical connector 100 according to a fifth embodiment of the present invention, which is different from the third embodiment in that the first elastic arm 23A is not provided with the first abutting portion 231A.

Figure 20:
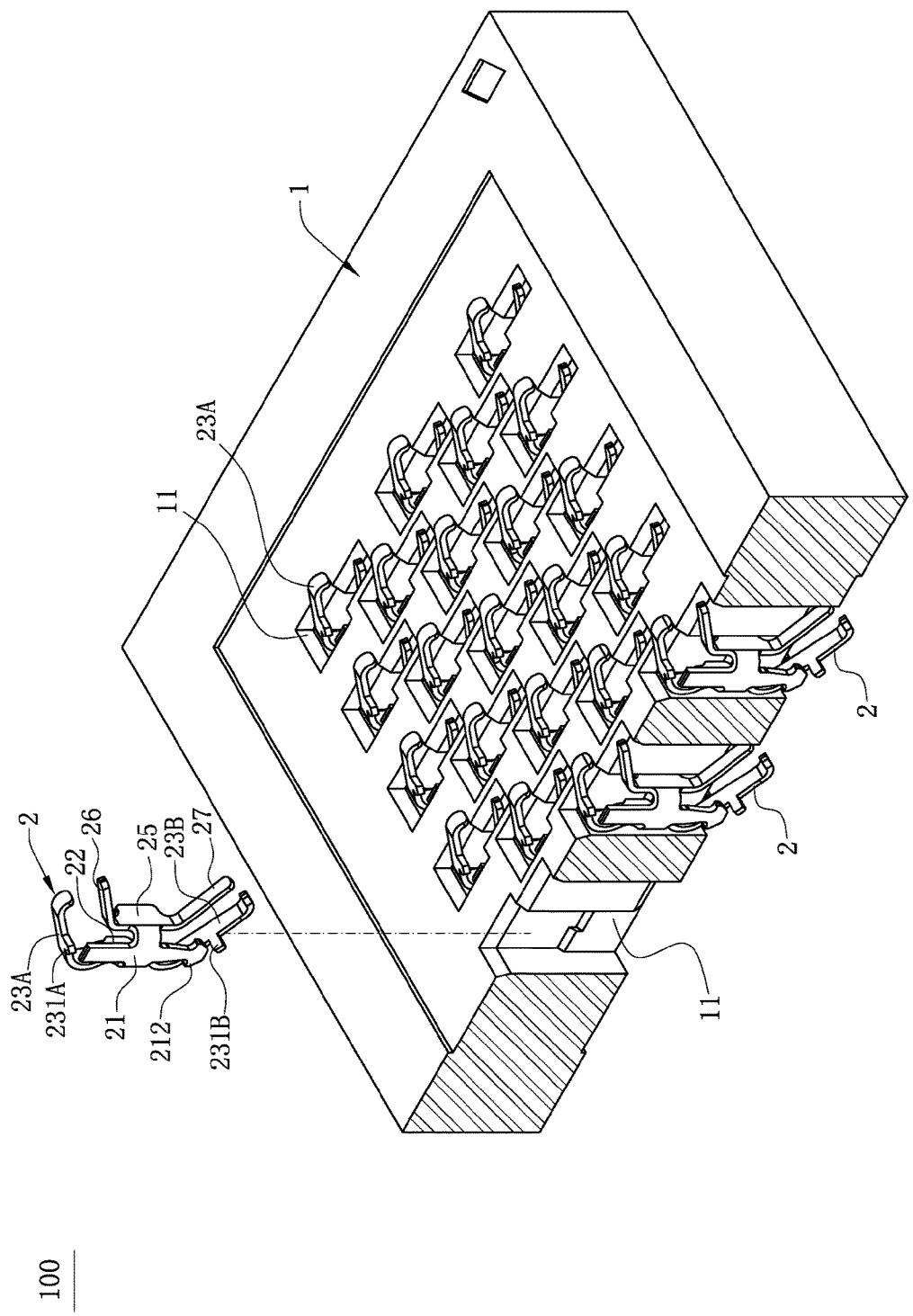
FIG. 20 is a perspective view of an electrical connector according to a sixth embodiment of the present invention before a chip module is pressed downward.
Figure 21:
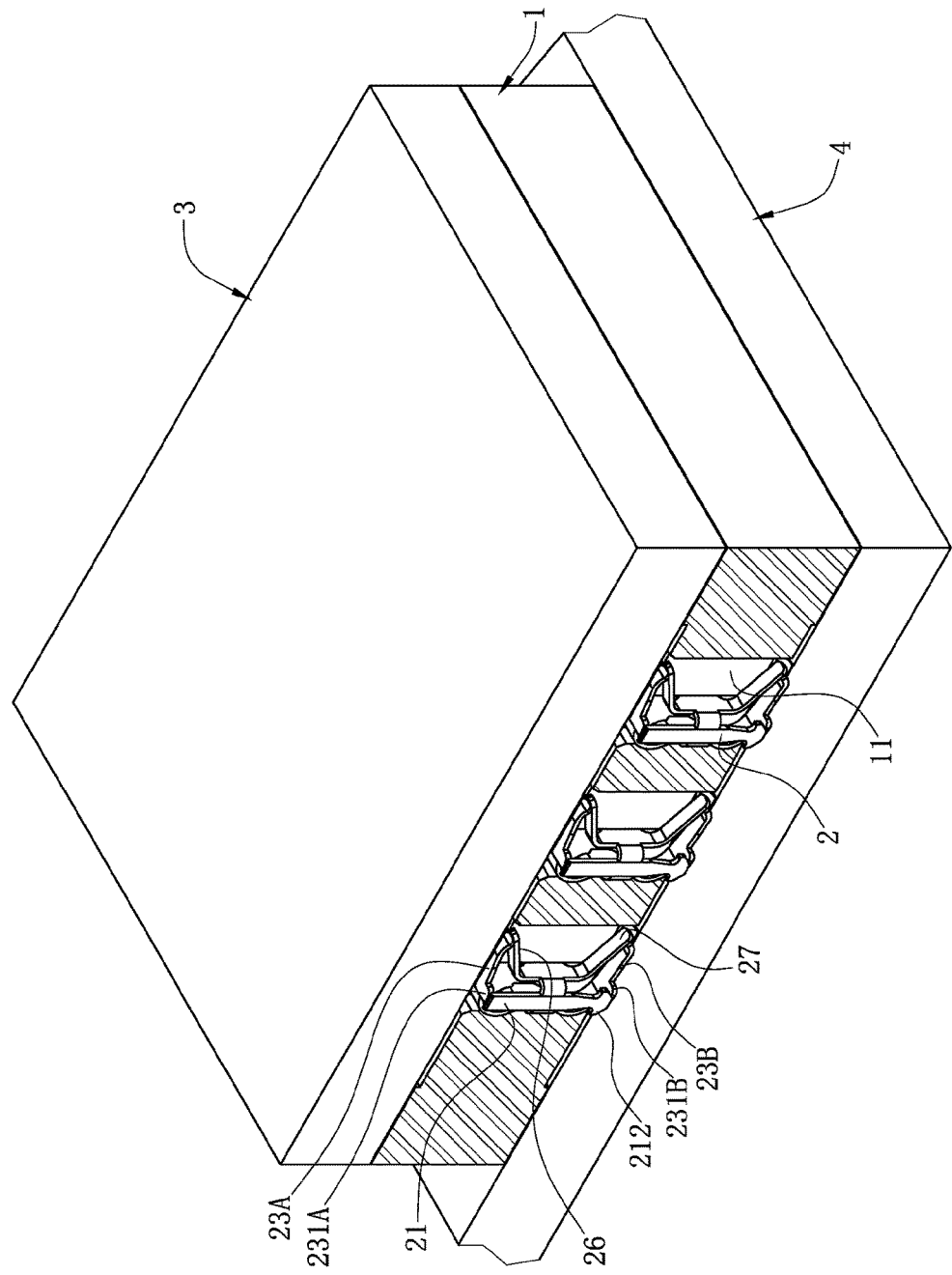
FIG. 21 is a perspective view of an electrical connector in FIG. 20 after a chip module is pressed downward.
Figure 22:
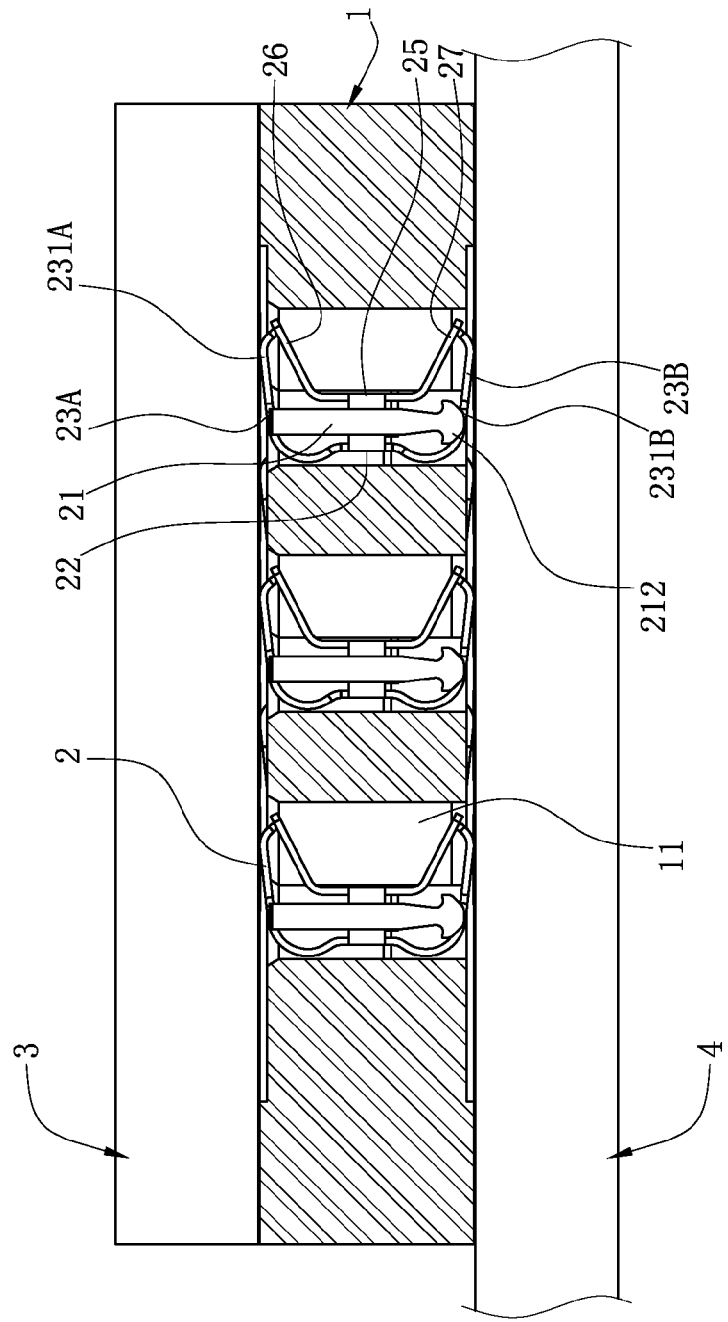
FIG. 22 is a front view of FIG. 21.

FIG. 20 to FIG. 22 show an electrical connector 100 according to a sixth embodiment of the present invention, which is different from the first embodiment in the features characterized as follows.

The connecting portion 22 is perpendicular to the flat plate portion 21, and the side edges of the first abutting portion 231A and the second abutting portion 231B abut the plate surface of the flat plate portion 21.

The terminal 2 further includes a bonding portion 25. The bonding portion 25 and the connecting portion 22 are formed by bending and extending from two opposite sides of the flat plate portion 21 respectively, and the bonding portion 25 and the connecting portion 22 are located on a same side of a vertical plane where the flat plate portion 21 is located.

An upper arm 26 is formed by bending and extending upward from a top end of the bonding portion 25, and a lower arm 27 is formed by bending and extending downward from a bottom end of the bonding portion 25. The upper arm 26 and the lower arm 27 are symmetrically disposed, and free ends of the first elastic arm 23A and the second elastic arm 23B extend across a vertical plane where the bonding portion 25 is located.

When the chip module 3 presses the first elastic arm 23A down, the free end of the first elastic arm 23A abuts the upper arm 26, and the free end of the second elastic arm 23B abuts the lower arm 27, so as to form, between the chip module 3 and the circuit board 4, a third parallel conductive path which sequentially passes through the chip module 3, the first elastic arm 23A, the upper arm 26, the bonding portion 25, the lower arm 27, the second elastic arm 23B and the circuit board 4, so that impedance and self-induction effect during signal transmission can be further reduced.

To sum up, the electrical connector accordingly to certain embodiments of the present invention has the following beneficial effects.

(1) When the chip module 3 presses the terminal 2 downward, the side edges of the first elastic arm 23A and the second elastic arm 23B abut the flat plate portion 21, so that the structures of the first elastic arm 23A and the second elastic arm 23B can be simplified to reduce the processing difficulty thereof. Moreover, an abutting force between the flat plate portion 21 and the first elastic arm 23A as well as the second elastic arm 23B is not in a vertical direction, so the pressure of the chip module 3 on the terminal 2 does not influence urging of the first elastic arm 23A and the second elastic arm 23B against the flat plate portion 21, and therefore a conductive path which sequentially passes through the chip module 3, the first elastic arm 23A, the connecting portion 22, the second elastic arm 23B and the circuit board 4 and a conductive path which sequentially passes through the chip module 3, the first elastic arm 23A, the first abutting portion 231A, the flat plate portion 21, the second abutting portion 231B, the second elastic arm 23B and the circuit board 4, which are parallel to each other, can be stably formed, thereby reducing electrical impedance during telecommunication transmission between the chip module 3 and the circuit board 4. Moreover, the side edges of the first elastic arm 23A and the second elastic arm 23B abut the flat plate portion 21 so that oxidation layers formed on the first elastic arm 23A, the second elastic arm 23B and the flat plate portion 21 can be scraped off, and an abutting effect of the first elastic arm 23A and the second elastic arm 23B against the flat plate portion 21 is enhanced, thereby ensuring a good electrical connection between the chip module 3 and the circuit board 4.

(2) When the chip module 3 presses the first elastic arm 23A downward, the free end of the first elastic arm 23A abuts the plate surface of the second elastic arm 23B, so as to form, between the chip module 3 and the circuit board 4, a third parallel conductive path which sequentially passes through the chip module 3, the first elastic arm 23A, the second elastic arm 23B and the circuit board 4, so that impedance and self-induction effect during signal transmission can be further reduced.

(3) When the chip module 3 presses the first elastic arm 23A downward, the free end of the first elastic arm 23A abuts the upper arm 26, and the free end of the second elastic arm 23B abuts the lower arm 27, so as to ensure a stable contact between the first arm and the upper arm 26 and between the second arm and the lower arm 27. Meanwhile, the supporting effect of the terminal 2 for the chip module 3 is enhanced, and a third parallel conductive path which sequentially passes through the chip module 3, the first elastic arm 23A, the upper arm 26, the bonding portion 25, the lower arm 27, the second elastic arm 23B and the circuit board 4 is formed between the chip module 3 and the circuit board 4, so that impedance and self-induction effect during signal transmission can be further reduced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to electrically connect a chip module to a circuit board, comprising:
    a body, configured to upward support the chip module, wherein the body is provided with a plurality of accommodating holes; and
    a plurality of terminals, respectively accommodated in the accommodating holes correspondingly, each of the terminals comprising a flat plate portion along a vertical direction and a connecting portion connected to the flat plate portion, wherein an elastic arm is formed by bending and extending from at least one end of the connecting portion so as to abut the chip module or the circuit board, and when the chip module presses the terminal downward, a side edge of the elastic arm abuts the flat plate portion.

2. The electrical connector of claim 1, wherein the flat plate portion is formed by extending from one side of the connecting portion, a position limiting portion is formed by extending from an opposite side of the connecting portion, and each of the accommodating holes is protrudingly provided with a first protruding block on one side surface thereof and located below the position limiting portion so as to limit the corresponding terminal from moving downward.

3. The electrical connector of claim 2, wherein the flat plate portion, the connecting portion and the position limiting portion are located on a same vertical plane.

4. The electrical connector of claim 1, wherein the flat plate portion has a stopping portion located higher than a connecting position between the flat plate portion and the connecting portion, each of the accommodating holes has a stopping surface located below the stopping portion so as to limit the corresponding terminal from moving downward, and the elastic arm abuts a side of the flat plate portion away from the stopping portion.

5. The electrical connector of claim 1, wherein the flat plate portion has a hook portion located lower than a connecting position between the flat plate portion and the connecting portion, each of the accommodating holes is protrudingly provided with a second protruding block on one side surface thereof and is located above the hook portion so as to limit the corresponding terminal from moving upward, and the elastic arm abuts a side of the flat plate portion away from the hook portion.

6. The electrical connector of claim 1, wherein a side edge of the elastic arm is protrudingly provided with an abutting portion, and a side edge of the abutting portion abuts the flat plate portion.

7. The electrical connector of claim 6, wherein there are two elastic arms, defined as a first elastic arm and a second elastic arm; the first elastic arm is formed by bending and extending upward from an upper end of the connecting portion and is configured to abut the chip module, and the second elastic arm is formed by bending and extending downward from a lower end of the connecting portion and is configured to abut the circuit board; a side edge of the first elastic arm is protrudingly provided with a first abutting portion; and when the chip module presses the first elastic arm downward, the first elastic arm and the second elastic arm abut each other, and the first abutting portion is located higher than an abutting position between the first elastic arm and the second elastic arm.

8. The electrical connector of claim 7, wherein a side edge of the second elastic arm is protrudingly provided with a second abutting portion, and the second abutting portion of the second elastic arm is located lower than the abutting position between the first elastic arm and the second elastic arm.

9. The electrical connector of claim 1, wherein the connecting portion is perpendicular to the flat plate portion, two elastic arms are formed by bending and extending from two opposite ends of the connecting portion respectively, and the two elastic arms are located on a same side of a vertical plane where the flat plate portion is located.

10. The electrical connector of claim 9, wherein each of the elastic arms extends from one of the ends of the connecting portion toward a direction away from a vertical plane where the connecting portion is located, and then reversely bends and extends across the vertical plane where the connecting portion is located, and the two elastic arms are symmetrically disposed.

11. The electrical connector of claim 1, wherein the elastic arm has an abutting portion abutting the flat plate portion, and a width of the elastic arm is gradually reduced from the abutting portion to a free end of the elastic arm, such that a guide chamfer is formed at a side edge of the elastic arm so as to guide the abutting portion to abut the flat plate portion.

12. The electrical connector of claim 1, wherein the flat plate portion comprises a base, an extending portion extending from one side of the base and connected to the connecting portion, and a blocking portion protruding from an opposite side of the base, and each of the accommodating holes is protrudingly provided with a third protruding block and a fourth protruding block on one side surface thereof and are correspondingly located below the blocking portion and the extending portion so as to limit the corresponding terminal from moving downward.

13. The electrical connector of claim 12, wherein two barbs are formed on two opposite sides of a bottom end of the base and are located below the third protruding block and the fourth protruding block, and one side of the third protruding block and one side of the fourth protruding block are respectively provided with an inclined surface so as to guide the barbs.

14. The electrical connector of claim 12, wherein a height of the extending portion is between upper and lower edges of the blocking portion.

15. The electrical connector of claim 1, wherein a side edge of the elastic arm abuts a plate surface of the flat plate portion.

16. The electrical connector of claim 1, wherein a side edge of the elastic arm abuts a plate edge of the flat plate portion.

17. The electrical connector of claim 1, wherein each of the terminals further comprises a bonding portion, the bonding portion and the connecting portion are formed by bending and extending from two opposite sides of the flat plate portion respectively, the bonding portion and the connecting portion are located on a same side of a vertical plane where the flat plate portion is located, an upper arm is formed by bending and extending upward from a top end of the bonding portion, the elastic arm is formed by bending and extending upward from the top end of the connecting portion and is configured to abut the chip module upward, and when the chip module presses the elastic arm downward, the elastic arm abuts the upper arm.

18. The electrical connector of claim 17, wherein a free end of the elastic arm extends across a vertical plane where the bonding portion is located, and the free end of the elastic arm abuts the upper arm.

19. An electrical connector, configured to electrically connect a chip module to a circuit board, comprising:
    a body, configured to upward support the chip module, wherein the body is provided with a plurality of accommodating holes; and
    a plurality of terminals, respectively accommodated in the accommodating holes correspondingly, each of the terminals comprising a flat plate portion and a connecting portion connected to the flat plate portion, wherein the flat plate portion is disposed along a vertical direction and configured to be connected to a strip, an elastic arm is formed by bending and extending from at least one end of the connecting portion so as to abut the chip module or the circuit board, and when the chip module presses the terminal downward, the elastic arm abuts the flat plate portion.

20. An electrical connector, configured to be electrically connected with a chip module, comprising:

a body, configured to upward support the chip module, wherein the body is provided with a plurality of accommodating holes; and a plurality of terminals, respectively accommodated in the accommodating holes correspondingly, each of the terminals comprising a flat plate portion and a connecting portion connected to the flat plate portion, wherein the flat plate portion is configured to be connected to a strip, an elastic arm is formed by bending and extending from the connecting portion so as to abut the chip module, and when the chip module presses the terminal downward, the elastic arm abuts the flat plate portion.

* * * * *